Nov. 10, 1970 A. W. BRADLEY ET AL 3,539,879

RETAINING CLIP AND GUIDE FOR A CIRCUIT BOARD

Filed Sept. 6, 1968

INVENTORS
ALAN W. BRADLEY
DAVID D. LEAHY
BY A. C. Smith
ATTORNEY

United States Patent Office 3,539,879
Patented Nov. 10, 1970

3,539,879
RETAINING CLIP AND GUIDE FOR A CIRCUIT BOARD

Alan W. Bradley, Edinburgh, and David D. Leahy, West Lothian, Scotland, assignors to Hewlett-Packard Ltd., West Lothian, Scotland, a corporation of Great Britain
Filed Sept. 6, 1968, Ser. No. 757,914
Int. Cl. H05k
U.S. Cl. 317—101 1 Claim

ABSTRACT OF THE DISCLOSURE

A strip of resilient material having an elongated hole is mounted on a frame such as an instrument chassis for retaining a planar member, as for example a circuit board, in a selected position along a pair of longitudinal grooves which support opposite edges of the board. The strip is disposed along an edge of the circuit board, near one of the board corners whereby it resiliently bends across the corner and receives the corner to retain the board in the selected position. At least one of the longitudinal grooves is formed by an elongated portion of the strip remote from the hole, thus providing a unitary clip and guide for retaining a circuit board in an instrument chassis.

BACKGROUND AND SUMMARY OF THE INVENTION

The increased use and development of the printed circuit board by the electronics industry has created a demand for a simple inexpensive means of retaining a planar member such as a circuit board in a frame such as the chassis of an electronic instrument. It is desirable that the board be rigidly fixed to the chassis to provide a good electrical and thermal ground; yet ideally the circuit board should be readily removable for repair or replacement of it or the circuit elements mounted upon it.

The present invention, as shown by the illustrated embodiment, provides a clip or metal or plastic for retaining a circuit board in, for example, an electronic instrument chassis. The board is held in one plane by a pair of longitudinal grooves in elongated members along opposite edges of the board. The circuit board is restrained from motion in its plane in these grooves by a clip of resilient material mounted on the chassis and formed from a strip having an elongated hole along its length. The strip is bent across a corner of the circuit board into the plane of the board allowing the elongated hole to receive a portion of the corner of the circuit board, thus retaining the board at a desired position along the pair of longitudinal grooves.

The preferred embodiment of the invention is a unitary circuit board clip and guide wherein at least one of the elongated side support members is formed as an integral portion of the retaining clip. A portion of the clip extends alongside the printed circuit board edge and has longitudinal grooves which support this edge of the board. The present invention thus provides a simple, inexpensive means of providing this circuit board retention in conjunction with the circuit board mounting structure.

DESCRIPTION OF THE PREFERRED EMBODIMENT

Figure 2:
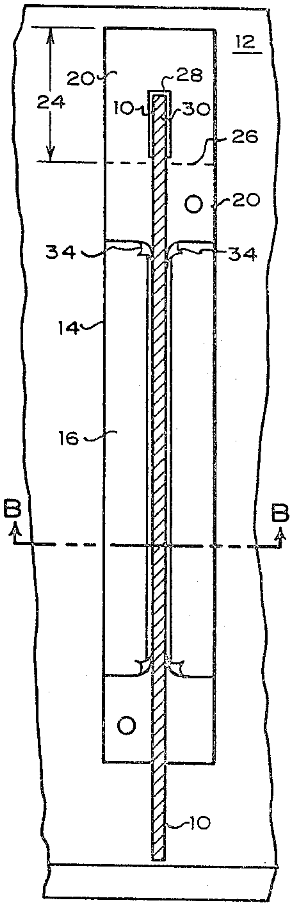
FIG. 2 is a sectional view of the preferred embodiment of the invention taken along the line A—A of FIG. 1.
Figure 3:
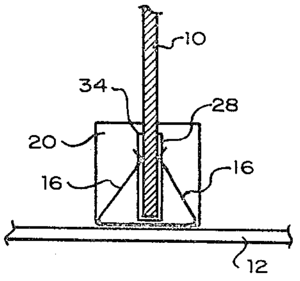
FIG. 3 is a sectional edge view of the preferred embodiment of the invention taken along the line B—B of FIG. 2.

Referring now to the drawings, there is shown planar member 10 in the form of a circuit board mounted on frame 12 which may be an instrument chassis. As shown in detail in FIGS. 2 and 3, circuit board 10 is guided into this mounted position by elongated members 14 having longitudinal grooves supporting opposite edges of circuit board 10. Portions 16 or elongated members 14 are bent to hold circuit board 10 from both sides of the board, while allowing circuit board 10 to slide laterally in its own plane between portions 16 for easy removal of circuit board 10.

Retaining strip 20 forms the clip for retaining printed circuit board 10 in operative position on frame 12. Retaining strip 20 is formed of a resilient plastic or metal and is capable of being anchored to frame 12, possibly by rivets at points 22. In the preferred embodiment of the invention, retaining strip 20 is integral with one of elongated members 14.

Figure 1:
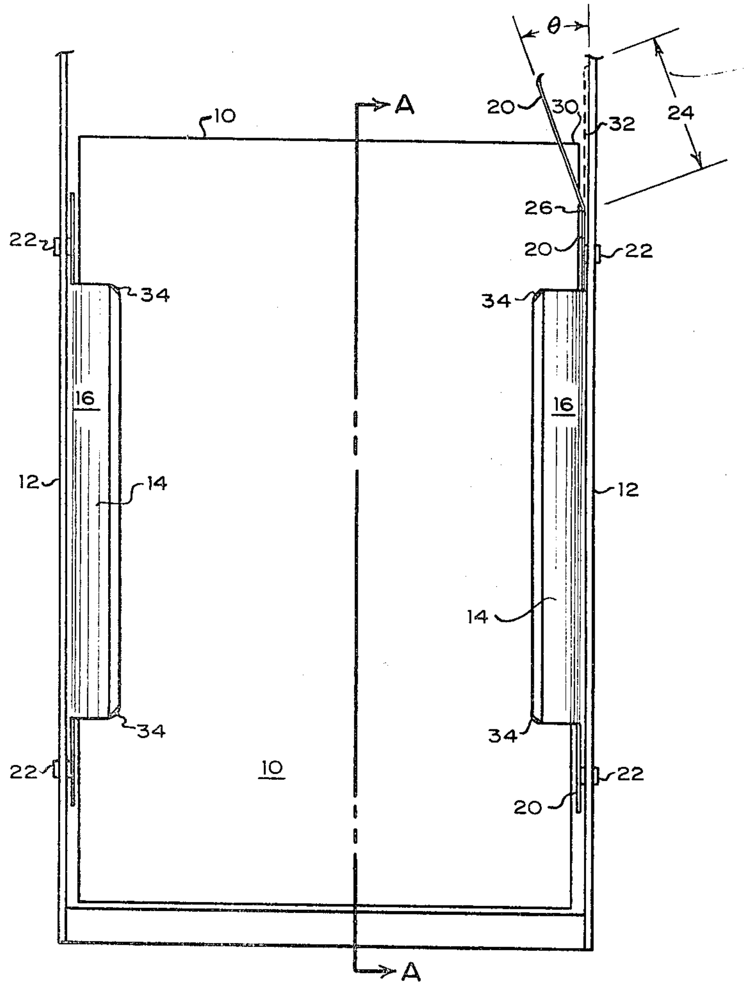
FIG. 1 is a top view of the preferred embodiment of the invention viewed perpendicularly to the plane of the circuit board.

Retaining strip 20 includes a portion of length 24 which is resiliently biased to a position in the plane of board 10, having been formed at a selected angle $\phi$ with respect to frame 12. The portion of length 24 of retaining strip 20 includes elongated hole 28 disposed for receiving corner 30 of circuit board 10 when portion 24 of strip 20 is so inclined at angle $\phi$ with respect to frame 12. By temporarily bending portion 24 of strip 20 to decrease angle $\phi$, and sliding circuit board 10 betwen portions 16 of elongated members 14, circuit board 10 may be removed or inserted in frame 12. This temporary position of portion 24 of strip 20 is shown by dashed lines at 32 in FIG. 1.

The integral clip and guide of the preferred embodiment may be fabricated of a resilient metal to provide an electrical as well as a mechanical connection between frame 12 and circuit board 10. This will provide a grounding of a conductor-coated circuit board 10 to the potential of frame 12 to shield the circuitry of board 10 from possible high frequency interference from adjacent circuitry. Ends 34 of portions 16 have been beveled or bent slightly to prevent damage to board 10 or its conductive coating during insertion or removal of board 10.

Thus a unitary clip and guide is provided for electrically and mechanically retaining the planar circuit board in a frame against movement in its plane, while allowing simple removal of insertion of the board in the frame.

We claim:

1. Unitary guide support and lock apparatus for retaining in position on a frame a substantially planar circuit board which has spaced longitudinal edges and a transverse edge that forms a corner with a longitudinal edge of the circuit board, the unitary apparatus comprising:

a retainer portion for attachment to a frame;

a guide portion integral with said retainer portion and forming a longitudinal support groove having guide support edges disposed to resiliently contact opposite planar surfaces of a circuit board near a longitudinal edge thereof, the support groove having an entrance end for receiving an edge of a circuit board in longitudinally slidable engagement within the support groove; and a lock portion integral with said retainer portion near the entrance end of the longitudinal support groove formed by the guide portion and normally disposed in skew relationship to the retainer portion in resiliently biased position in line with the support groove over the entrance end thereof, the lock portion including an aperture disposed substantially in line with the longitudinal support groove to provide a locking edge in the region of said aperture remote from said entrance end, said locking edge resiliently communicating with a transverse edge of a circuit board disposed with a longitudinal edge thereof in the support groove of said guide portion, whereby the lock portion is resiliently biased into position blocking the entrance end of the support groove for return to that position upon insertion of the longitudinal edge of a circuit board into and along the direction of the support groove by a sufficient distance to permit the locking edge carried by said lock portion to engage the transverse edge of the circuit board, thereby to prevent withdrawal of the circuit board in a direction along the support groove until the lock portion is manually urged away from position over the entrance end of the support groove.

References Cited

UNITED STATES PATENTS

| | | | |
|---|---|---|---|
| 3,047,648 | 7/1962 | Mowatt | 317—100 |
| 3,130,351 | 4/1964 | Giel | 317—101 |
| 3,169,214 | 2/1965 | Whitehorn | 317—101 |
| 3,303,394 | 2/1967 | Peter et al. | 317—101 |
| 3,110,873 | 11/1963 | Mittermaier | 24—259 X |
| 3,392,668 | 7/1968 | Young | 24—259 X |

FOREIGN PATENTS

| | | |
|---|---|---|
| 37,653 | 4/1965 | Germany. |
| 1,454,097 | 8/1966 | France. |
| 898,224 | 6/1962 | Great Britain. |

OTHER REFERENCES

Product Engineering Publication, June 10, 1963.

LEWIS H. MEYERS, Primary Examiner

G. P. TOLIN, Assistant Examiner